(12) United States Patent
Somerkoski et al.

(10) Patent No.: US 10,115,511 B2
(45) Date of Patent: Oct. 30, 2018

(54) METAL ASSEMBLY COMPRISING A SUPERCONDUCTOR

(71) Applicant: Luvata Espoo Oy, Espoo (FI)

(72) Inventors: Jukka Somerkoski, Vanha-Ulvila (FI); Antti Kilpinen, Abo (FI)

(73) Assignee: MMC Copper Products Oy, Pori (FI)

( * ) Notice: Subject to any disclaimer, the term of this patent is extended or adjusted under 35 U.S.C. 154(b) by 2 days.

(21) Appl. No.: 15/508,011

(22) PCT Filed: Aug. 28, 2015

(86) PCT No.: PCT/EP2015/069716
§ 371 (c)(1),
(2) Date: Mar. 1, 2017

(87) PCT Pub. No.: WO2016/034503
PCT Pub. Date: Mar. 10, 2016

(65) Prior Publication Data
US 2017/0243681 A1 Aug. 24, 2017

(30) Foreign Application Priority Data

Sep. 1, 2014 (FI) ..................................... 20145755

(51) Int. Cl.
*H01F 6/06* (2006.01)
*H01F 6/02* (2006.01)
(Continued)

(52) U.S. Cl.
CPC ........... *H01F 6/06* (2013.01); *G01R 33/3804* (2013.01); *G01R 33/3815* (2013.01); *H01F 6/02* (2013.01); *H01F 6/04* (2013.01)

(58) Field of Classification Search
CPC .... H01F 6/06; G01R 33/3804; G01R 33/3815
See application file for complete search history.

(56) References Cited

U.S. PATENT DOCUMENTS

| 3,743,986 A | 7/1973 | McInturff et al. |
| 4,333,228 A | 6/1982 | Koch |

(Continued)

FOREIGN PATENT DOCUMENTS

| CN | 102708988 A | 10/2012 |
| JP | H0471112 A | 3/1992 |

(Continued)

OTHER PUBLICATIONS

Yamamoto et al., Helical and poloidal coil R&D in LHD, Fusion Engineering and Design, vol. 41, 231-239, 1998.

(Continued)

*Primary Examiner* — Paul A Wartalowicz
(74) *Attorney, Agent, or Firm* — Hodgson Russ LLP

(57) ABSTRACT

A metal assembly (1) suitable for being wound into a coil and used in DC magnet applications. The metal assembly comprises an insulated superconductive wire (2) extending in a longitudinal direction. The insulated superconductive wire comprises a superconductive wire (4), comprising a material (5) that exhibits superconducting properties within a defined temperature range embedded in a metal matrix (6), and an electrically insulating layer (7) arranged as a coating on the superconductive wire. The metal assembly further comprises a thermal conduction element (3) comprising a thermally conductive material arranged as a layer at least partly surrounding the insulated superconductive wire, such that the metal assembly, when wound into a coil, exhibits isotropic or essentially isotropic thermal conduction properties.

16 Claims, 3 Drawing Sheets

(51) Int. Cl.
G01R 33/38 (2006.01)
G01R 33/3815 (2006.01)
H01F 6/04 (2006.01)

(56) References Cited

U.S. PATENT DOCUMENTS

| | | | |
|---|---|---|---|
| 5,814,122 A * | 9/1998 | Huang | C03B 37/022 |
| | | | 505/420 |
| 5,917,393 A | 6/1999 | Kupiszewski et al. | |
| 6,339,194 B1 * | 1/2002 | Larsen | H01L 39/16 |
| | | | 174/125.1 |
| 2005/0109049 A1 * | 5/2005 | Chan | G01R 33/3815 |
| | | | 62/129 |
| 2008/0186026 A1 * | 8/2008 | Leussler | G01R 33/422 |
| | | | 324/318 |
| 2012/0196753 A1 * | 8/2012 | Laskaris | F25D 19/00 |
| | | | 505/163 |

FOREIGN PATENT DOCUMENTS

| | | |
|---|---|---|
| WO | 2006035065 A2 | 4/2006 |
| WO | 2008007141 A1 | 1/2008 |

OTHER PUBLICATIONS

Zeller et al., Radiation resistant magnet R&D at the NSCL, Proceedings of the 2003 Particle Accelerator Conference, 161-163, 2003.

Gregory, Multifilamentary superconducting materials for large scale applications, Cryogenics, vol. 22, No. 5, 203-212, May 1982.

* cited by examiner

METAL ASSEMBLY COMPRISING A SUPERCONDUCTOR

TECHNICAL FIELD OF THE INVENTION

The present invention relates to a metal assembly comprising an insulated superconductive wire according to the preamble of claim 1. It also relates to a coil for an electromagnet comprising such a metal assembly and to a conduction cooled electromagnet. Metal assemblies according to the invention can also be used in cryogen cooled magnets. The metal assembly of the present invention is mainly, but not exclusively, intended for use in DC magnet applications, such as in nuclear magnetic resonance (NMR) and magnetic resonance imaging (MRI) applications.

PRIOR ART

Low temperature superconductors, such as NbTi and $Nb_3Sn$ or derivatives thereof are typically used at 4.2 K (liquid helium temperature) to create strong magnetic fields in superconductor applications such as research magnets, nuclear magnetic resonance (NMR) and magnetic resonance imaging (MRI) applications. Various coil winding techniques, such as wet winding, dry winding, or epoxy impregnation, can be used for designing superconducting magnets for use in such applications. In all these cases, the coil comprises a superconductive wire whose outer periphery is coated with an electrical insulation layer such as polyvinyl acetal resins (Formvar), polyethylenimine (PEI), polyethylene terephthalate (PET), glass fiber, polyester, polyimide (PI), etc., creating also a thermal insulation between wire turns and layers of the magnet. Successful use of such insulated structures depends strongly on liquid helium's capability to effectively cool the coil windings.

Due to a shortage of liquid helium, there is an ongoing struggle to minimize the needs for liquid helium in superconductor applications. For example, there are now magnets which can be used dry without liquid helium, i.e. so called cryo-cooled magnets, or conduction cooled magnets, in which the coil windings are in vacuum and the cooling is effected by means of cryo-pumps through thermal conduction elements connected to the magnet windings. For example, cooling of the inner parts of the winding can be improved by arranging separate thermal conduction passage ways with additional thermal conduction elements of e.g. copper or aluminium. However, it is difficult to achieve sufficiently effective cooling of the magnet with such a method. Another problem is that the magnets provided using this method will suffer from a reduced overall current density and thus a lower magnetic field, or alternatively require a higher volume and more expensive superconductive wire for creating the same magnetic field.

SUMMARY OF THE INVENTION

An object of the present invention is to provide a metal assembly comprising an insulated superconductive wire which is in at least some aspect improved with respect to prior art metal assemblies comprising insulated superconductive wires. In particular, it is an object to provide a metal assembly for use within a conduction cooled superconducting magnet which allows for a more efficient cooling of the magnet. Another object is to provide a metal assembly for use within a conduction cooled superconducting magnet by means of which the size of the magnet can be reduced in comparison with known conduction cooled magnets such as discussed above.

These objects are achieved by a metal assembly comprising at least one insulated superconductive wire extending in a longitudinal direction, wherein each of the at least one insulated superconductive wire comprises:
 a superconductive wire, comprising a material that exhibits superconducting properties within a defined temperature range embedded in a metal matrix, and
 an electrically insulating layer arranged as a coating on the superconductive wire.

The metal assembly is characterized in that it further comprises a thermal conduction element comprising a thermally conductive material arranged as a layer at least partly surrounding the at least one insulated superconductive wire, such that the metal assembly, when wound into a coil, exhibits isotropic or essentially isotropic thermal conduction properties.

Using the metal assembly according to the invention it is possible to achieve a conduction cooled superconducting magnet with improved thermal conduction within the coil windings of the magnet. The thermal conduction element, which is arranged in intimate contact with at least part of the electrically insulating layer of at least one insulated superconductive wire, allows for heat conduction in all directions within the coil windings when the metal assembly is wound into a coil. For a coil with several layers, the inner layers of the coil are cooled via the thermal conduction element, creating thermal conduction passage ways to the outer layers of the coil, where cooling elements are located. Of course, it is also possible to instead or additionally locate cooling elements in the inner or in the middle layers of the coil, depending on what is most convenient or cost effective from a magnet construction point of view. By means of the thermal conduction element providing three-dimensional isotropic thermal conduction within the coil windings, heat can be conducted away efficiently with a minimum usage of helium. With the metal assembly according to the invention, the thermal conduction element is integrated with the at least one insulated superconductive wire, and a magnet comprising this assembly wound into a coil can therefore be made much more compact than a magnet in which thermal conduction elements in the form of metal sheets have to be inserted between successive layers of coil windings. The metal assembly is particularly suitable for use in DC magnet applications.

According to one embodiment of the invention, the thermal conduction element has an average layer thickness of at least 0.2 times the equivalent diameter of the at least one insulated superconductive wire, preferably at least 0.5 times. With such a layer thickness, the thermal conduction properties of the metal assembly become isotropic when the metal assembly is wound into a coil with several turns and layers. Using a too small layer thickness may result in insufficient thermal conduction in a transverse direction of the coil, and thus the cooling of the coil windings will be less efficient. The equivalent diameter of the insulated superconductive wire is here to be understood as the diameter of a round wire with a cross sectional area equal to the actual cross sectional area of the insulated superconductive wire. In the case of a round wire, the equivalent diameter is the diameter of the wire.

According to one embodiment of the invention, the thermal conduction element and the metal matrix within the at least one insulated superconductive wire together have a volume of at least two times the volume of the material that exhibits superconducting properties within a defined temperature range, preferably at least five times. With such a volume ratio, the magnet is protected if it quenches, i.e. enters a normal, resistive state. Furthermore, this volume ratio allows for a sufficient layer thickness of the thermal conduction element such that isotropic thermal conduction properties may be achieved.

According to one embodiment of the invention, the thermally conductive material is chosen from copper, copper alloy, aluminium, aluminium alloy, or a composite comprising copper and aluminium. Those materials provide the stabilization needed and have good thermal conduction properties at low temperatures. If a low weight is preferred, aluminium alloy or a composite comprising copper and aluminium can be used.

According to a preferred embodiment of the invention, the thermally conductive material is chosen from high purity copper, high purity aluminium, or copper-clad aluminium composite. High-purity copper and aluminium have excellent heat conduction properties at low temperatures and copper-clad aluminium composite may be used in the case when a low weight in combination with elevated mechanical strength is desired.

According to a preferred embodiment of the invention, the electrically insulating layer comprises an insulator having a resistivity of at least $10^7$ Ωm, preferably at least $10^{10}$ Ωm. This provides excellent insulation and dielectric strength well above 1 kV. Thus, the layer is able to withstand high voltage differences, such as when a superconducting magnet quenches, without disastrous shortcuts.

According to one embodiment of the invention, the electrically insulating layer comprises a polymer based insulator, preferably selected from the group of polyvinyl acetal resins (Formvar), polyethylenimine (PEI), polyethylene terephthalate (PET), glass fiber, polyester, and polyimide (PI). Apart from providing excellent electrical insulation, polymer based insulators have the additional advantage of providing flexibility. The metal assembly can thereby be more easily handled since the risk of damaging the electrically insulating layer is reduced.

According to one embodiment of the invention, the metal assembly further comprises a highly electrically resistive layer arranged as a coating on the thermal conduction element. Such a layer should be relatively thin compared to the thermal conduction element and is useful for preventing eddy currents in the thermal conduction element, which may otherwise cause undesirable heating. In the case when the metal assembly is primarily intended for use in high vacuum, it is preferable that the highly electrically resistive layer has a low partial evaporation pressure. A highly electrically resistive layer is here to be understood as a layer which at low temperatures has a relatively high resistivity compared to the metal matrix embedding the superconducting filaments, such as at least 10 times, preferably more than 100 times, higher resistivity than the metal matrix.

According to one embodiment of the invention, said highly electrically resistive layer is a metallic layer comprising chromium, nickel, tin, indium, or alloys thereof. Those elements all have low partial evaporation pressure and high resistivity, and may be applied in the form of thin coatings.

According to another embodiment of the invention, said highly electrically resistive layer is a ceramic or oxide layer comprising e.g. aluminium oxide, chromium oxide, titanium oxide, zirconium oxide, or alumina-titania.

According to another embodiment of the invention, said highly electrically resistive layer is an electrically insulating organic polymer film. The film may be comprised of polyvinyl acetal resin, PEI, PI or PET or the like. Although such a film also has thermal insulation properties, if the layer is made thin enough, such as less than 100 μm thick, preferably less than 10 μm thick, the overall thermal conduction in a coil comprising the metal assembly is still sufficient.

According to one embodiment of the invention, the metal assembly is arranged as a wire-in-channel structure, in which the at least one insulated superconductive wire is arranged in a longitudinal groove in the thermal conduction element. The channel is thus formed in the thermal conduction element. Even though the thermal conduction element does not completely cover the insulated superconductive wire, when wound into a coil with several layers, each successive turn of the insulated superconductive wire will be surrounded by thermally conductive material. Therefore, the thermal conduction properties of the coil are still isotropic. Preferably, the metal assembly in this embodiment has a rectangular or a substantially rectangular transverse cross section, to allow for a high filling factor when the coil is wound.

According to another embodiment of the invention, the thermal conduction element is arranged as a layer completely surrounding the at least one insulated superconductive wire. Such a thermal conduction element provides coil windings comprising the metal assembly with cooling passage ways in all directions also in the case when a round cross section is desired, or when the coil windings are less tightly wrapped.

According to one embodiment of the invention, the metal assembly further comprises a metal mesh arranged outermost in the metal assembly. Such a metal mesh arranged outside the thermal conduction element is useful if a coil winding comprising the metal assembly is to be fixed by means of epoxy impregnation. The metal mesh on one hand allows epoxy to penetrate into the metal assembly locking the metal assembly effectively, and on the other hand provides thermal conduction bridges between successive coil turns and layers during operation of a magnet comprising the coil.

The invention also relates to a coil for an electromagnet comprising a metal assembly according to the invention such as described above, to a conduction cooled electromagnet comprising such a coil, and to a cryogen cooled electromagnet comprising such a coil. The conduction cooled magnet may be either cryogen cooled or cryogen free. Preferred embodiments and advantages of such a coil and electromagnet correspond to those described above.

BRIEF DESCRIPTION OF THE DRAWINGS

A detailed description of the invention with reference to the appended drawings follows below. In the drawings.

DETAILED DESCRIPTION OF EMBODIMENTS OF THE INVENTION

Transverse cross sections of seven different embodiments of a metal assembly according to the invention are schematically shown in FIG. 1-7. The same reference signs have been used to designate equal or similar components for all shown embodiments.

Figure 1:
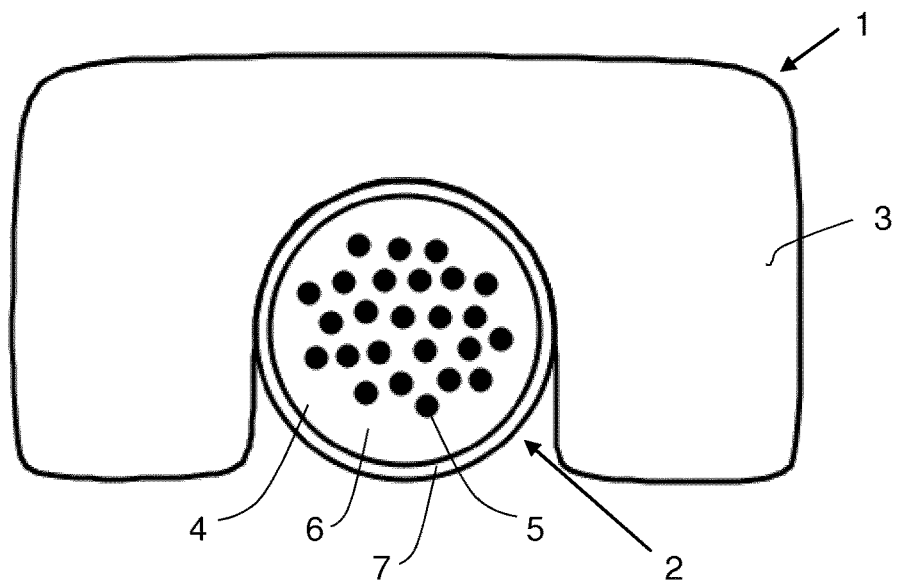
FIG. 1 schematically shows a cross section of a metal assembly according to a first embodiment of the invention, FIG. 2 schematically shows a cross section of a metal assembly according to a second embodiment of the invention, FIG. 3 schematically shows a cross section of a metal assembly according to a third embodiment of the invention, FIG. 4 schematically shows a cross section of a metal assembly according to a fourth embodiment of the invention, FIG. 5 schematically shows a cross section of a metal assembly according to a fifth embodiment of the invention, FIG. 6 schematically shows a cross section of a metal assembly according to a sixth embodiment of the invention, and FIG. 7 schematically shows a cross section of a metal assembly according to a seventh embodiment of the invention.

A first embodiment of a metal assembly 1 according to the invention is shown in FIG. 1. The metal assembly 1 according to this embodiment is a so called wire-in-channel structure comprising an insulated superconductive wire 2 extending in a longitudinal direction, which is inserted into a groove formed in a thermal conduction element 3. The insulated superconductive wire 2 comprises a superconductive wire 4, which consists of filaments 5 of a material that exhibits superconducting properties within a defined temperature range embedded in a metal matrix 6. The insulated superconductive wire 2 further comprises an electrically insulating layer 7 arranged as a coating on the superconducting wire 4. The insulated superconductive wire 2 has a circular cross section in the shown embodiment. However, it can also be rectangular or square in shape when e.g. a high aspect ratio conductor geometry is preferred.

In order to achieve an intimate contact between the insulated superconductive wire 2 and the thermal conduction element 3, the insulated superconductive wire can be mechanically locked in the groove by a suitable metal forming method, such as drawing through a die having a rectangular opening, or rolling using e.g. a so called 4-roll Turk's head. The intimate contact can also be achieved e.g. by applying epoxy on the surface of the insulated superconductive wire with an in situ impregnation method. In some cases, thermally conducting epoxy resins or their composites with either relatively low or relatively high electrical conductivity can be selected for the purpose depending on the specific application.

Figure 2:
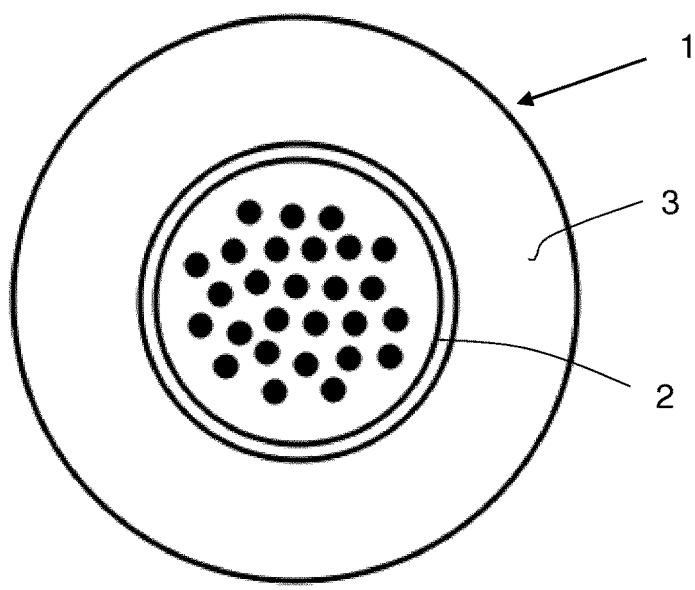

A second embodiment of the metal assembly 1 according to the invention is shown in FIG. 2. The metal assembly 1 according to this embodiment differs from the first embodiment in that the thermal conduction element 3 completely covers the insulated superconductive wire 2. The thermal conduction element 3 is in the form of a layer with a homogeneous thickness, and the metal assembly therefore has a circular cross section. The insulated superconductive wire 2 is composed of the same elements as in the first embodiment and has a circular cross section.

Figure 3:
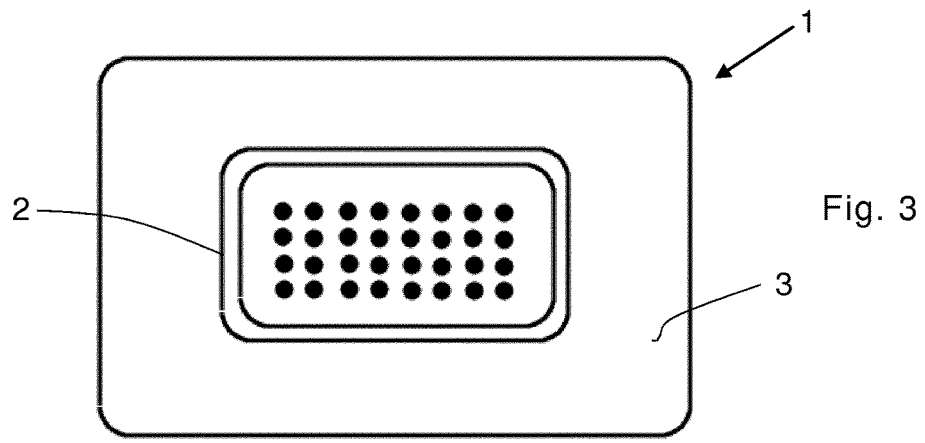

A third embodiment of the metal assembly 1 according to the invention is shown in FIG. 3. As in the second embodiment, the thermal conduction element 3 completely covers the insulated superconductive wire 2. The metal assembly 1 differs from the metal assembly 1 according to the second embodiment in that the insulated superconductive wire 2 and the metal assembly 1 have essentially rectangular cross sections with rounded corners.

Figure 4:
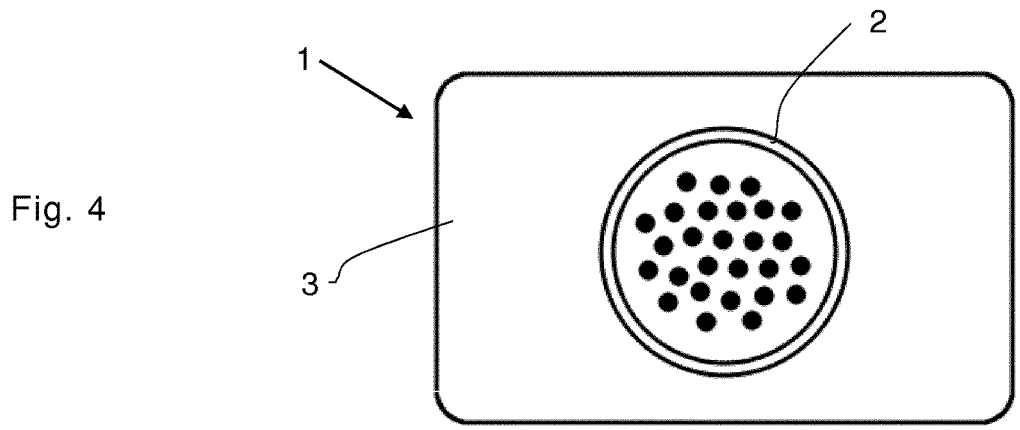

A fourth embodiment of the metal assembly 1 according to the invention is shown in FIG. 4. In this embodiment, the insulated superconductive wire 2 has a circular cross section, while the metal assembly 1 has an essentially rectangular cross section with rounded corners. When wound into a coil, the rectangular outer cross section increases the filling factor in comparison with a circular cross section.

The metal assembly 1 according to the second, third and fourth embodiments can be produced by cladding the insulated superconductive wire 2 with a material which is to constitute the thermal conduction element 3, e.g. a metal strip. This can be done using well known cladding techniques such as wrapping or welding, or using a low temperature extrusion technique, preferably a continuous extrusion technique such as the so called Conform extrusion process. Preferably, extrusion is performed at a temperature of less than 300° C. after which quick cooling follows.

Figure 5:
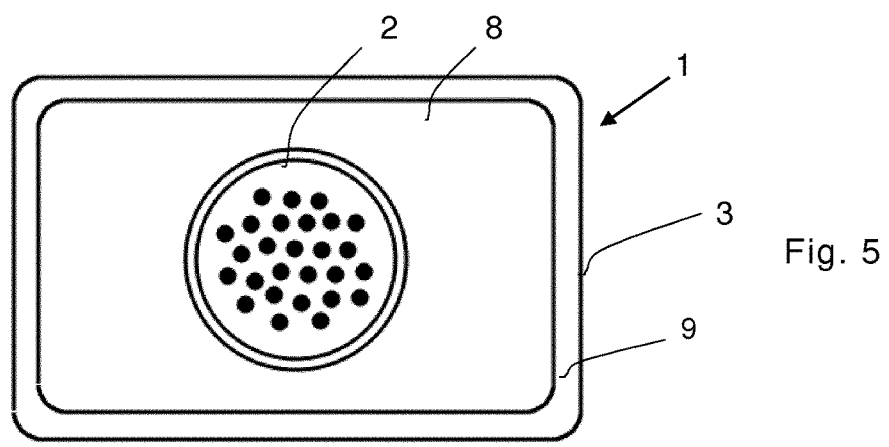

A fifth embodiment of the metal assembly 1 according to the invention is shown in FIG. 5. In this embodiment, the insulated superconductive wire 2 is covered by a composite thermal conduction element 3, comprising an aluminium layer 8 and a copper layer 9 which completely covers the aluminium layer. The metal assembly according to this embodiment can be produced by cladding the insulated superconductive wire 2 with aluminium using a low temperature extrusion technique at a temperature of less than 300° C., preferably a continuous extrusion technique such as the Conform extrusion process. Thereafter, the insulated superconductive wire 2 with the aluminium layer 8 is cladded with e.g. high purity copper using well-known cladding techniques used in cable industry.

Figure 6:
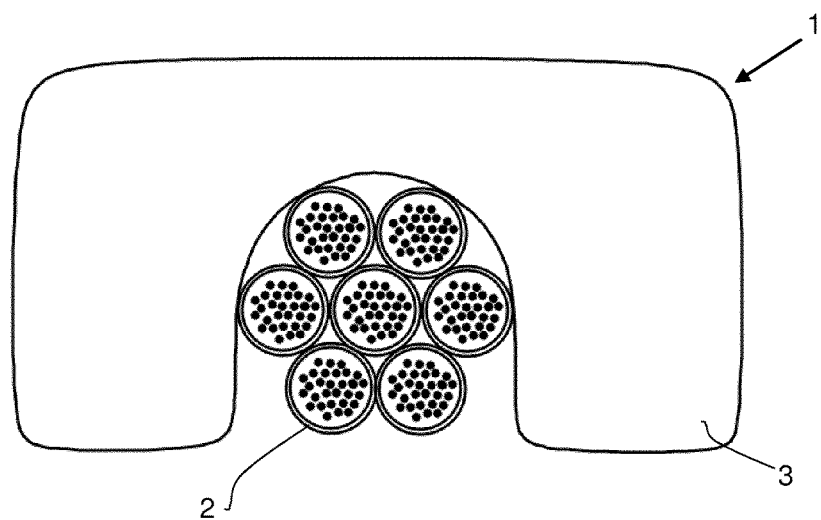

A sixth embodiment of the metal assembly 1 is shown in FIG. 6. In this embodiment, several insulated superconductive wires 2 are inserted into a groove formed in a thermal conduction element 3, forming a wire-in-channel structure. The insulated superconductive wires 2 may be transposed or cabled into a cable form before being inserted into the groove.

Figure 7:
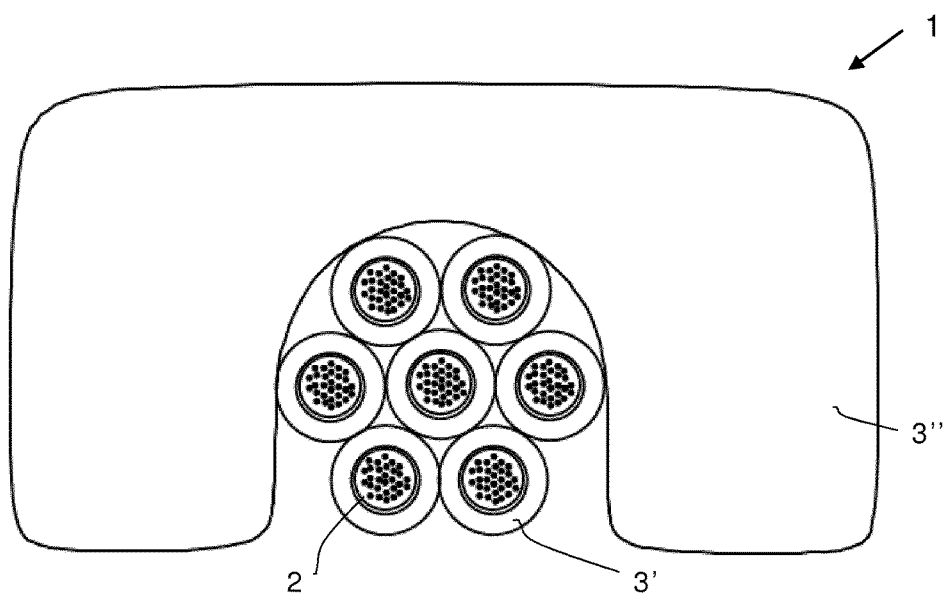

A metal assembly 1 according to a seventh embodiment of the invention is shown in FIG. 7. In this embodiment, several insulated superconductive wires 2, each including a thermal conduction element 3', are bundled or cabled together and inserted into a groove formed in a larger thermal conduction element 3". The total amount of thermally conductive material within the thermal conduction elements 3', 3" should be such as to achieve isotropic thermal conduction when the metal assembly 1 is wound into a coil.

Also in the embodiments shown in FIG. 2-5, the single insulated superconductive wire 2 may be exchanged for a bundle of insulated superconductive wires, such as a cable.

In all shown embodiments, the thermal conduction element can further be coated with a material that forms a thin, highly electrically resistive layer (not shown) covering the metal assembly. This layer is typically 1-50 μm thick, preferably 1-10 μm thick, and could be e.g. a metallic, ceramic or an oxide layer comprising chromium, nickel, tin, indium and alloys thereof, which have both low partial evaporation pressures and high electrical resistivity. Tin, indium, and alloys thereof can be coated using e.g. molten metal coating or electroplating, whereas other metals can be coated using e.g. electroplating, chemical vapour deposition or physical vapour deposition. The coating can be applied to the thermal conduction element before or after assembly of the thermal conduction element and the insulated superconductive wire.

The highly electrically resistive layer may also be formed from an organic polymer material such as polyvinyl acetal resin, PEI, PET, PI or the like. In that case, the layer is preferably applied on the surface of the thermal conduction element after the assembly of the thermal conduction element and the insulated superconductive wire using e.g.

electron beam curing or ultraviolet curing at temperatures close to ambient temperatures, preferably below 300° C. Although said organic polymer materials also have thermally insulating properties, a thin layer of 1-50 μm, preferably 1-10 μm, still allows good thermal conduction passage ways within the windings of a coil made from the metal assembly.

In all shown embodiments, the superconductive wire 4 may be comprised of any superconductive material that can be produced in long lengths in round, rectangular or tape shape. The superconductive wire 4 may e.g. be a so called low temperature wire comprising one or multiple filaments 5 of a material such as NbTi or $Nb_3Sn$, or alloys thereof.

The metal matrix 6 in which the filaments 5 are embedded may be a high purity copper matrix or an aluminium or aluminium alloy matrix. For AC magnet applications, NbTi filaments 5 embedded in a copper alloy matrix 6 alloyed with manganese or nickel are suitable. For DC magnet applications, NbTi filaments 5 embedded in a high purity copper matrix are suitable.

If $Nb_3Sn$ filaments are used, those niobium filaments are preferably embedded in an intimate tin containing copper matrix (so called bronze method), or in a copper matrix with a tin or tin alloy source (so called internal tin method), typically surrounded by a niobium and/or tantalum diffusion barrier and stabilising copper. Before integration with the thermal conduction element, the wire, or alternatively a cable composite is insulated with e.g. high temperature glass insulation. The high temperature reaction to form $Nb_3Sn$ superconductive phase may take place before or after a coil winding operation. Due to a high reaction temperature, the thermal conduction element is insulated with suitable chromium, ceramic or oxide coating.

The superconductive wire 4, normalised to contain 50% of the superconducting material, is typically 0.5-1.5 mm in equivalent diameter in order to be able to carry a large enough current for creating a strong magnetic field in a large volume.

The electrically insulating layer 7 may, in all shown embodiments, be made from insulating materials typically used in the field for NbTi. Such materials include ceramic insulators as well as polymer based insulators, e.g. selected from the group of polyvinyl acetal resins (Formvar), polyethylenimine (PEI), polyethylene terephthalate (PET), glass fiber, polyester, and polyimide (PI). The thickness of the electrically insulating layer 7 typically varies between 30-100 μm, providing sufficient electrical insulation between turns and layers and is arranged so that it completely covers the periphery of the superconductive wire 4.

The thermal conduction element 3 is in all shown embodiments preferably made from a high purity cryogenic grade copper or high purity aluminium. It may also be made from a copper clad aluminium composite channel or a construction such as shown in FIG. 5, copper alloys, or aluminium alloys, depending on the requirements on the final product. The thermal conduction element 3 is preferably in the form of a layer extending along the insulated superconductive wire 2 and in intimate contact therewith, either with a homogeneous thickness around the periphery of the insulated superconductive wire 2, or with a thickness that varies around the periphery. The layer may completely or partly cover the insulated superconductive wire 2. In the case when the layer only partly covers the insulated superconductive wire 2, it should preferably cover the main portion of the wire surface, so that when the metal assembly 1 is wound into a coil, the insulated superconductive wire 2 is surrounded by the material of the thermal conduction element 3.

The thermal conduction element 3 should typically have an average layer thickness of 0.10 mm or more, preferably at least 0.50 mm, depending on the dimension of the superconductive wire 4. The thermal conduction element 3 preferably has an average layer thickness of at least 0.2 times the equivalent diameter of the insulated superconductive wire 2, preferably at least 0.5 times. The thermal conduction element 3 and the metal matrix 6 within the insulated superconductive wire 2 should together preferably have a volume of at least two times the volume of the superconducting filaments 5, more preferably at least five times.

The metal assembly 1 according to any of the shown embodiments is, for use in a cryogen cooled magnet, e.g. in a liquid helium cooled magnet, or alternatively in a cryogen free conduction cooled magnet, wound into a coil in the form of a solenoid comprising at least one layer of the metal assembly 1, preferably several layers. In the conduction cooled magnet, the thermal conduction element 3 apart from providing thermal conduction also provides electrical stabilization. This is particularly important if, in operation, the superconducting wire 4 undergoes a transition to a normal stage for some reason, for example due to magnetic disturbance, flux jump, mechanical wire movement, etc. In this case, the current is automatically led through the thermal conduction element 3 and the superconducting wire 4 is allowed to cool down so that the superconducting stage can be resumed.

In a coil used in an electromagnet winding comprising the metal assembly 1, the metal assembly may be fixed to avoid relative movement of the metal assembly within the coil. The metal assembly may e.g. be fixed using epoxy impregnation. In that case, it is preferable to provide the metal assembly with a metal mesh cladded onto the thermal conduction element or to a coating provided on the outside of the thermal conduction element. The metal mesh can for example be cladded onto the surface of the metal assembly and be in the form of thin high purity copper or aluminium wires braided around the metal assembly.

The insulated superconductive wire can also be based on $MgB_2$ alloys, or any other superconductive material suitable for being manufactured in long lengths and creating strong magnetic fields, using state of the art construction wire designs.

The invention is of course not in any way restricted to the embodiments described above, but many possibilities to modifications thereof would be apparent to a person with skill in the art without departing from the scope of the invention as defined in the appended claims.

The invention claimed is:

1. A metal assembly (1) comprising at least one insulated superconductive wire (2) extending in a longitudinal direction, wherein the at least one insulated superconductive wire (2) comprises:
    a superconductive wire (4), comprising a material (5) that exhibits superconducting properties within a defined temperature range embedded in a metal matrix (6), and
    an electrically insulating layer (7) arranged as a coating on the superconductive wire (4), wherein the electrically insulating layer (7) comprises a polymer based insulator having a resistivity of at least $10^7$ Ωm, characterized in that the metal assembly (1) further comprises a thermal conduction element (3) comprising a thermally conductive material arranged as a layer at least partly surrounding the at least one insulated superconductive wire (2), such that the metal assembly (1), when wound into a coil, exhibits isotropic or essentially isotropic thermal conduction properties, wherein the thermally conductive material is chosen from copper, copper alloy, aluminium, aluminium alloy, or a composite comprising copper and aluminium.

2. The metal assembly according to claim 1, wherein the metal assembly further comprises a highly electrically resistive layer arranged as a coating on the thermal conduction element (3).

3. The metal assembly according to claim 2, wherein said highly electrically resistive layer is a metallic layer comprising chromium, nickel, tin, or alloys thereof.

4. The metal assembly according to claim 2, wherein said highly electrically resistive layer is a ceramic or oxide layer comprising aluminium oxide, chromium oxide, titanium oxide, zirconium oxide, or alumina-titania.

5. The metal assembly according to claim 2, wherein said highly electrically resistive layer is an electrically insulating organic polymer film.

6. The metal assembly according to claim 1, wherein the thermal conduction element (3) has an average layer thickness of at least 0.2 times the equivalent diameter of the at least one insulated superconductive wire (2).

7. The metal assembly according to claim 1, wherein the thermal conduction element (3) and the metal matrix (6) within the at least one insulated superconductive wire (2) together have a volume of at least two times the volume of the material (5) that exhibits superconducting properties within a defined temperature range.

8. The metal assembly according to claim 1, wherein the thermally conductive material is chosen from high purity copper, high purity aluminium, or copper-clad aluminium composite.

9. The metal assembly according to claim 1, wherein the electrically insulating layer (7) comprises an insulator having a resistivity of at least $10^{10}$ Ωm.

10. The metal assembly according to claim 1, wherein the polymer based insulator is selected from the group of polyvinyl acetal resins, polyethylenimine (PEI), polyethylene terephthalate (PET), glass fiber, polyester, and polyimide (PI).

11. The metal assembly according to claim 1, wherein the metal assembly (1) is arranged as a wire-in-channel structure, in which the at least one insulated superconductive wire (2) is arranged in a longitudinal groove in the thermal conduction element (3).

12. The metal assembly according to claim 1, wherein the thermal conduction element (3) is arranged as a layer completely surrounding the at least one insulated superconductive wire (2).

13. The metal assembly according to claim 1, wherein the metal assembly further comprises a metal mesh arranged outermost in the metal assembly.

14. A coil for an electromagnet comprising a metal assembly (1) according to claim 1.

15. A conduction cooled electromagnet comprising a coil according to claim 14.

16. A cryogen cooled electromagnet comprising a coil according to claim 14.

* * * * *